United States Patent
Lee

(10) Patent No.: US 7,821,289 B2
(45) Date of Patent: Oct. 26, 2010

(54) DATA OUTPUT DRIVING CIRCUIT AND METHOD FOR CONTROLLING SLEW RATE THEREOF

(75) Inventor: Dong-Uk Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 78 days.

(21) Appl. No.: 12/181,866

(22) Filed: Jul. 29, 2008

(65) Prior Publication Data

US 2009/0146682 A1    Jun. 11, 2009

(30) Foreign Application Priority Data

Dec. 11, 2007    (KR) .................... 10-2007-0128300

(51) Int. Cl.
*H03K 19/003* (2006.01)
*H03K 5/12* (2006.01)
(52) U.S. Cl. .................. 326/27; 326/26; 326/30; 327/170; 327/171; 327/108
(58) Field of Classification Search ................ 326/26, 326/27, 30; 327/108
See application file for complete search history.

(56) References Cited

U.S. PATENT DOCUMENTS

| | | | | |
|---|---|---|---|---|
| 5,568,081 A * | 10/1996 | Lui et al. | ................. | 327/380 |
| 5,859,541 A * | 1/1999 | McMahan et al. | ............. | 326/30 |
| 5,986,489 A * | 11/1999 | Raza et al. | ................. | 327/170 |
| 6,262,617 B1 | 7/2001 | McClure | | |
| 6,320,407 B1 * | 11/2001 | Sakamoto | ................. | 326/27 |
| 6,583,644 B2 * | 6/2003 | Shin | .................... | 326/26 |
| 6,664,805 B2 | 12/2003 | Gonzalez | | |
| 6,906,567 B2 * | 6/2005 | Culler | ................ | 327/170 |
| 7,053,679 B2 | 5/2006 | Rho | | |
| 7,170,324 B2 * | 1/2007 | Huber et al. | ................ | 327/170 |
| 7,170,342 B2 * | 1/2007 | Suzuki et al. | ............... | 330/149 |
| 7,202,702 B2 * | 4/2007 | Arnold et al. | ................. | 326/87 |
| 7,224,179 B2 | 5/2007 | Kim | | |
| 7,236,012 B2 | 6/2007 | Cho et al. | | |
| 7,248,088 B2 * | 7/2007 | Hargan | ................. | 327/170 |
| 7,339,409 B2 | 3/2008 | Choi et al. | | |
| 7,449,936 B2 * | 11/2008 | Shin et al. | ................... | 327/378 |
| 7,508,232 B2 * | 3/2009 | Lee et al. | .................... | 326/30 |
| 7,576,664 B2 * | 8/2009 | Lee | ................ | 341/55 |
| 7,719,307 B2 * | 5/2010 | Lee | ................ | 326/30 |
| 2008/0106297 A1 * | 5/2008 | Jao | ................ | 326/27 |

FOREIGN PATENT DOCUMENTS

| | | |
|---|---|---|
| JP | 2007-288667 | 11/2007 |
| KR | 1020050062036 A | 6/2005 |
| KR | 1020050097280 A | 10/2005 |
| KR | 1020070036554 A | 4/2007 |

* cited by examiner

*Primary Examiner*—Vibol Tan
(74) *Attorney, Agent, or Firm*—Baker & McKenzie LLP

(57) ABSTRACT

A data output driving circuit capable of optimizing a slew rate of data according to the variation of operational conditions and a method for controlling a slew rate thereof includes a slew rate control signal generating unit configured to generate slew rate control signals by using a code signal, and a plurality of drivers configured to output data by driving the data at a slew rate set according to the slew rate control signals.

11 Claims, 7 Drawing Sheets

DATA OUTPUT DRIVING CIRCUIT AND METHOD FOR CONTROLLING SLEW RATE THEREOF

CROSS-REFERENCES TO RELATED APPLICATION

This application claims the benefit under 35 U.S.C 119(a) of Korean application number 10-2007-0128300, filed on Dec. 11, 2007, which is incorporated by reference in its entirety by reference as if set forth in full.

BACKGROUND

1. Technical Field

The embodiments description herein relate to a semiconductor device, and more particularly to a data output driving circuit and a method for controlling a slew rate thereof.

2. Related Art

As shown in FIG. 1, a conventional data output driving circuit includes an on-die termination correction circuit 1 and a plurality of drivers (DRVs) 2. The on-die termination correction circuit 1 generates first codes "Pcode <0:K−1>" and second codes "Ncode <0:K−1>" to determine driving resistances of the plurality of drivers 2. The drivers 2 drive data signals "updo" and "dndo" according to the first and second codes "Pcode <0:K−1>" and "Ncode<0:K−1>" to output the data signals "updo" and "dndo" through a data input/output pad DQ. The drivers 2 are connected to the data input/output pad DQ in parallel.

Since the drivers 2 have the same structure, the driver 2, which receives the first and second codes "Pcode<0>" and "Ncode<0>", among the plurality of drivers 2 is representatively described with reference to FIG. 2. The driver 2 includes a plurality of NAND gates NR1 and NR2, a plurality of inverters IV1 and IV2, a plurality of resistors RP1, RP2, RN1, and RN2, a pull-up main driver M0, pull-up pre-drivers M2 and M3, a pull-down main driver M1, and pull-down pre-drivers M4 and M5.

If the first code "Pcode<0>" is activated in the driver 2, then the pull-up pre-drivers M2 and M3 drive the data signal "updo" to generate a pull-up driver driving signal "up". The pull-up main driver M0 drives the data input/output pad DQ with a data level by using a supply voltage according to the pull-up driver driving signal "up". If the second code "Ncode<0>" is activated in the driver 2, then the pull-down pre-drivers M4 and M5 drive the data signal "dndo" to generate a pull-down driver driving signal "dn". The pull-down main driver M1 drives the data input/output pad DQ with a data level by using a ground voltage according to the pull-down driver driving signal "dn".

A slew rate of data output through the data input/output pad DQ is determined according to the pull-up driver driving signal "up" and the pull-down driver driving signal "dn". The pull-up driver driving signal "up" and the pull-down driver driving signal "dn" are affected by variations in the operational conditions, that is, variations of a process/voltage/temperature (PVT). However, a conventional data output driving circuit has no hardware and software capable of controlling the pull-up and pull-down driver driving signals "up" and "dn" according to variations in the operational conditions. Accordingly, in a conventional data output driving circuit, the slew rate of the final output data is undesirably changed due to the variations in the operational conditions, such that a loss of a data may occur or an operational frequency may be limited.

SUMMARY

A data output driving circuit capable of optimizing a slew rate of data according to the variation of operational conditions and a method for controlling a slew rate thereof is described herein.

In one aspect, a data output driving circuit can include a slew rate control signal generating unit configured to generate slew rate control signals by using a code signal, and a plurality of drivers configured to output data by driving the data at a slew rate set according to the slew rate control signals.

In another aspect, a method for controlling a slew rate of a data output driving circuit can include detecting variation in an on-die termination code, and adjusting a slew rate of a data output driver based on the variation of the on-die termination code.

In a data output driving circuit and a method for controlling a slew rate thereof, a slew rate of data can be optimized according to the variation of operational conditions, such that the loss of a data eye can be prevented, and the range of an operational frequency can be expanded.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

A data output driving circuit and a method for controlling a slew rate thereof is described herein.

In the descriptions herein, an on-die termination correction circuit can repeatedly compare the resistance of an external resistor with the resistance of a duplicated resistor, which can be identical to a resistor of a driver, and can generate a code signal that can allow the duplicated resistor to have the resistance identical to the resistance of the external resistor. Since the duplicated resistor can be continuously affected by a process/voltage/temperature (PVT), the code signal can have a variable value that can correspond to the variation of the PVT. Therefore, the code signal can be used to adjust the slew rate of data to an optimal value.

Figure 3:
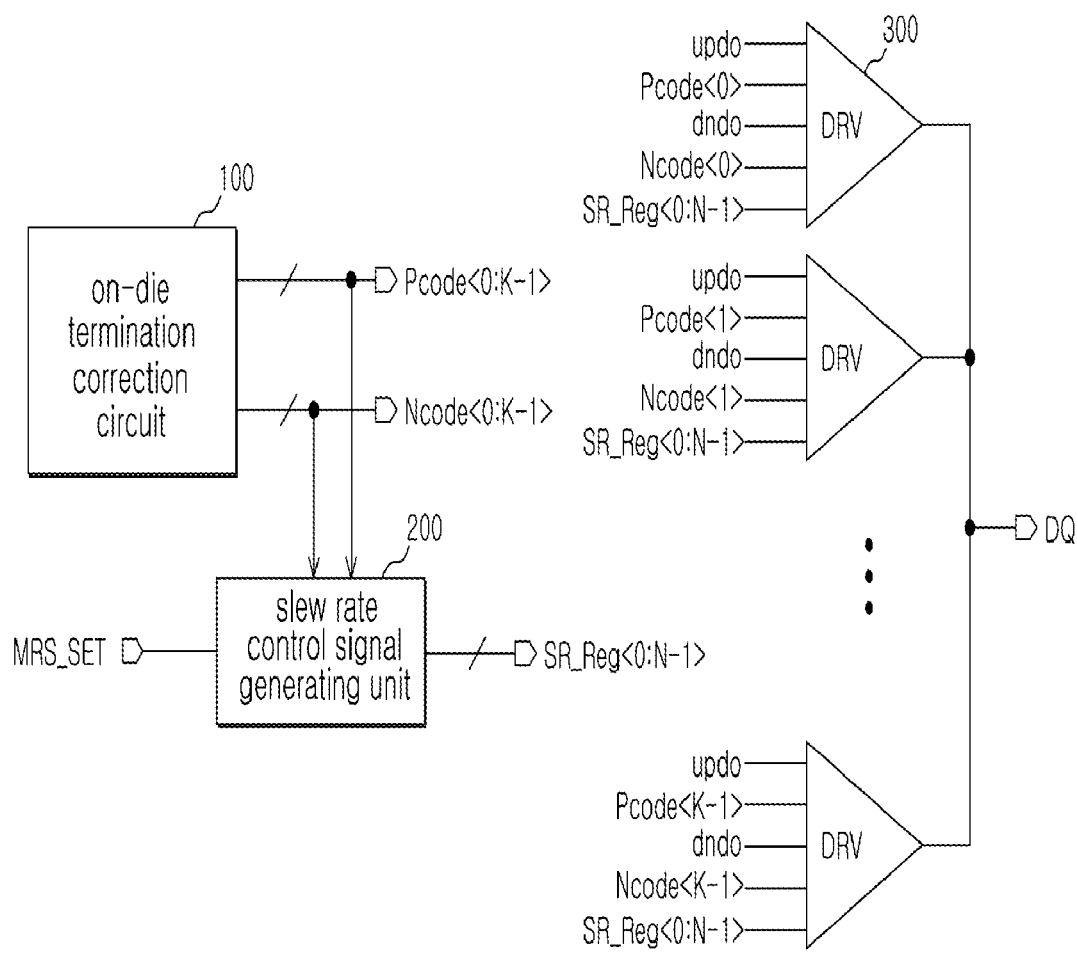
FIG. 3 is a circuit diagram showing a data output driving circuit according to one embodiment.

FIG. 3 is a circuit diagram showing a data output driving circuit 101 according to one embodiment. Referring to FIG. 3, the data output driving circuit 101 can include an on-die termination correction circuit 100, a slew rate control signal generating unit 200, and a plurality of drivers (DRVs) 300. As described above, the on-die termination correction circuit 100 can generate first codes "Pcode<0:K−1>" and second codes "Ncode<0:K−1>", which can have variable values that can correspond to the variation of the PVT.

Thus, if a voltage or a temperature rises, that is, the condition of the PVT is changed (hereinafter, referred to as "fast condition"), the first and second codes "Pcode<0:K−1>" and "Ncode<0:K−1>" can become smaller than previous first and second codes "Pcode<0:K−1>" and "Ncode<0:K−1>" in correspondence with the fast condition. Accordingly, the slew rate of data can become faster than a target slew rate under the fast condition.

Conversely, if a voltage or a temperature drops, that is, the condition of the PVT is changed (hereinafter, referred to as "slow condition"), the first and second codes "Pcode<0:K−1>" and "Ncode<0:K−1>" can become greater than the previous first and second codes "Pcode<0:K−1>" and "Ncode<0:K−1>" in correspondence with the slow condition. The slew rate of the data can becomes slower than a target slew rate under the slow condition.

Therefore, according to the above principle, the variation of the PVT, that is, the variation of a slew rate can be determined by using the first and second codes "Pcode<0:K−1>" and "Ncode<0:K−1>". The first and second codes "Pcode<0:K−1>" and "Ncode<0:K−1>" can have variable values corresponding to the variation of the PVT, and can be updated through a periodic on-die termination correction process.

The slew rate control signal generating unit 200 can generate slew rate control signals "SR_Reg<1:N−1>" through the combination of the first and second codes "Pcode<0:K−1>" and "Ncode<0:K−1>". The drivers 300 can adjust a slew rate according to the slew rate control signals "SR_Reg<1:N−1>". In addition, the drivers 300 can drive and can output data suitable for the first and second codes "Pcode<0:K−1>" and "Ncode<0:K−1>" based on the adjusted slew rate.

Figure 4:
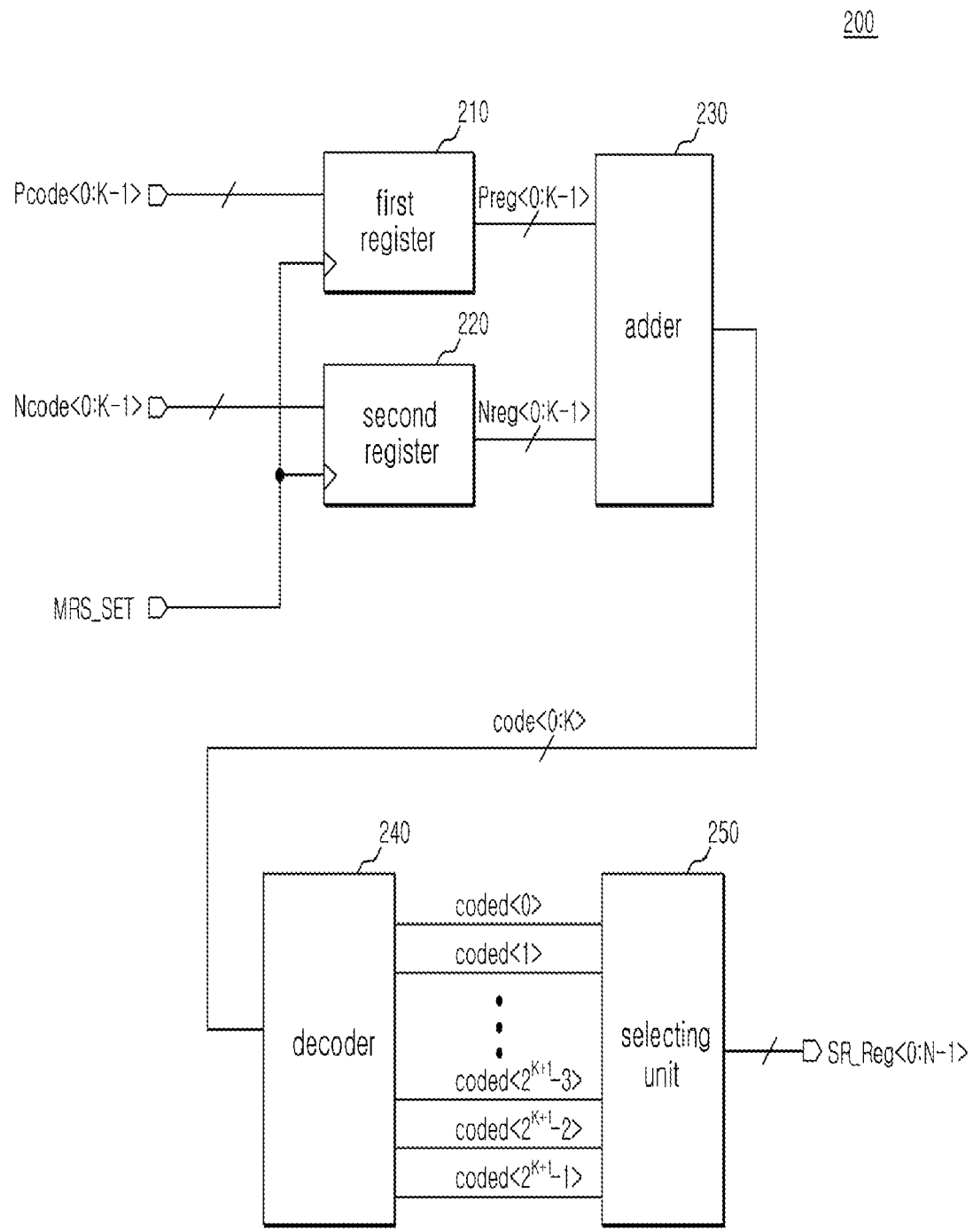
FIG. 4 is a block diagram showing an internal structure of a slew rate control signal generating unit that can be included in the circuit illustrated in FIG. 3.

FIG. 4 is a block diagram showing an internal structure of the slew rate control signal generating unit 200 that can be included in the circuit illustrated in FIG. 3. Referring to FIG. 4, the slew rate control signal generating unit 200 can include a first register 210, a second register 220, an adder 230, a decoder 240, and a selecting unit 250.

The first register 210 can store the first codes "Pcode<0:K−1>" according to a mode register set signal "MRS_SET" and can output first register values "Preg<0:K−1>". Similarly, the second register 220 can store the second codes "Ncode<0:K−1>" according to the mode register set signal "MRS_SET" and can output second register values "Nreg<0:K−1>".

An update period of the first and second codes "Pcode<0:K−1>" and "Ncode<0:K−1>" can be recognized based on the mode register set signal "MRS_SET". Accordingly, whenever the mode register set signal "MRS_set" occurs, the first and second registers 210 and 220 can store the first and second codes "Pcode<0:K−1>" and "Ncode<0:K−1>", and the slew rate control signals "SR_Reg<1:N−1>" can be updated by using the stored first and second codes "Pcode<0:K−1>" and "Ncode<0:K−1>". Additionally, the adder 230 can perform an adding operation with respect to the first and second register values "Preg<0:K−1>" and "Nreg<0:K−1>" to output an adding value "code<0:K>".

The decoder 240 can decode the adding value "code<0:K>" to output decoding signals "coded<0>" to "coded<$2^{k+1}-1$>". For example, the decoder 240 can activate the most significant bit "coded<$2^{k+1}-1$>" among the decoding signals "coded<0>" to "coded<$2^{k+1}-1$>" when the adding value "code<0:K>" is at a maximum level. In addition, the decoder 240 can sequentially activate bits lower than the most significant bit "coded<$2^{k+1}-1$>" as the adding value "code<0:K>" becomes gradually lower.

Figure 5:
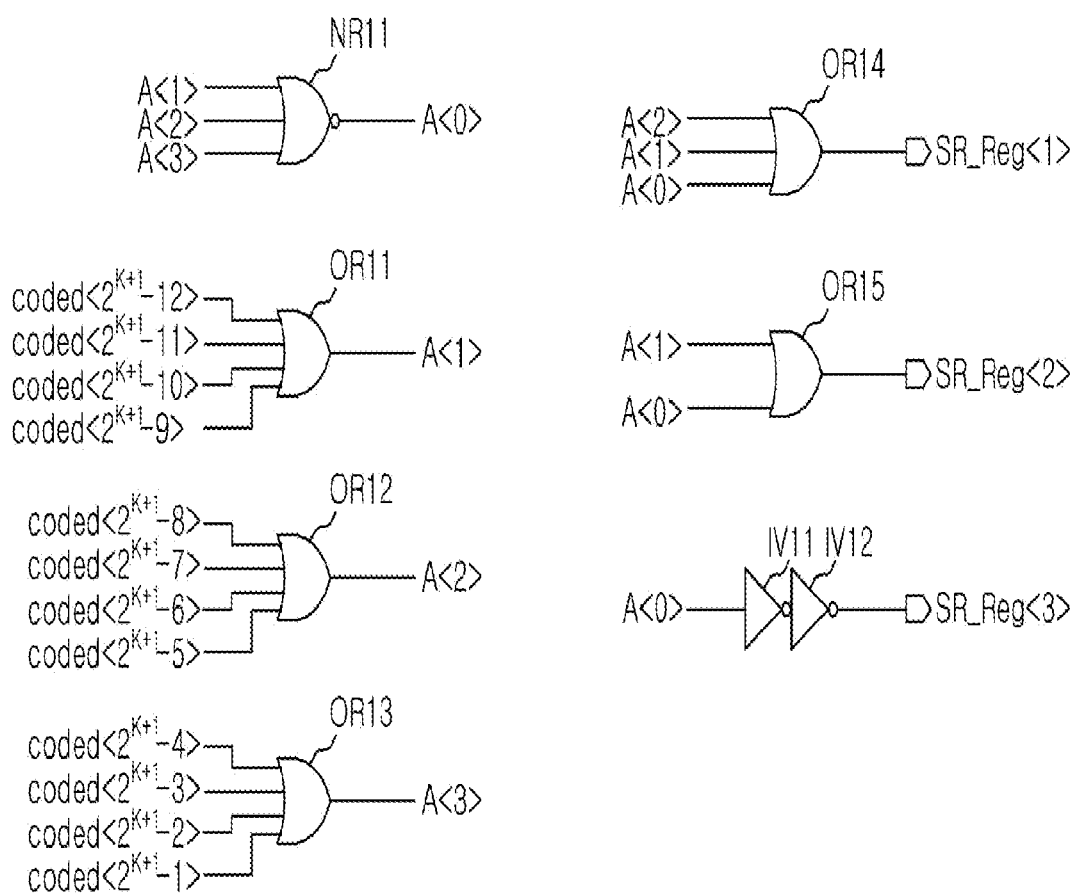
FIG. 5 is a circuit diagram showing a selecting unit that can be included in the circuit illustrated in FIG. 4.

The selecting unit 250 can generate the slew rate control signals "SR_Reg<1:N−1>" through the combination of the decoding signals "coded<0>" to "coded<$2^{k+1}-1$>" according to selected ranges. On the assumption that the N in the slew rate control signals "SR_Reg<1:N−1>" is, e.g., 4, the selecting unit 250 can have the structure shown in FIG. 5, which is a circuit diagram showing a selecting unit 250 that can be included in the circuit illustrated in FIG. 4. Referring to FIG. 5, the selecting unit 250 can classify the decoding signals "coded<0>" to "coded<$2^{k+1}-1$>" into a plurality of sections ranging from the least significant bit to the most significant bit, and can selectively activate and output the slew rate control signals "SR_Reg<1:N−1>" according to a section of an activated signal from among the decoding signals "coded<0>" to "coded<$2^{k+1}-1$>".

As shown in FIG. 5, the selecting unit 250 can include a NOR gate NR11, first to fifth OR gates OR11 to OR15, and buffers IV11 to IV12. The NOR gate NR11 and the first to third OR gates OR11 to OR13 can generate section determination signals "A<0>" to "A<3>", which can be used to define the section of the activated signals from among the decoding signals "coded<0>" to "coded<$2^{k+1}-1$>". The fourth and fifth OR gates OR14 and OR15 and the buffers IV11 and IV12 can output the slew rate control signals "SR_Reg<1:3>".

The third to first OR gates OR13 to OR11 can sequentially receive the decoding signals "coded<0>" to "coded<$2^{k+1}-1$>" in a unit of 4 bits on the basis of the most significant bit. The NOR gate NR11 can receive the section determination signals "A<1>" to "A<3>". The fourth OR gate OR14 can receive the section determination signals "A<0>" to "A<2>". The fifth OR gate OR15 can receive the section determination signals "A<0>" and "A<1>". The buffers IV11 and IV12 can receive the section determination signal "A<0>".

Figure 6:
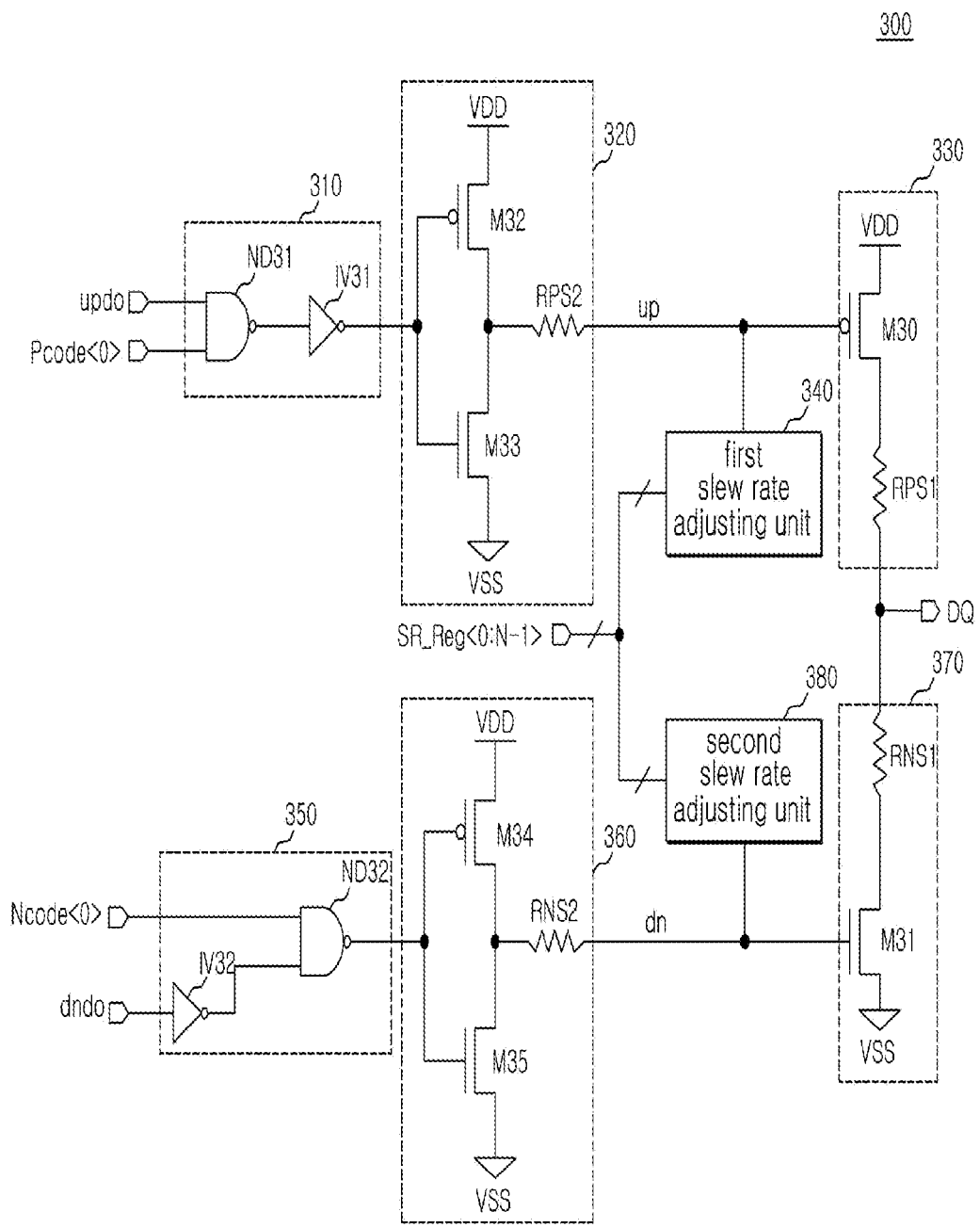
FIG. 6 is a circuit diagram showing a driver that can be included in the circuit illustrated in FIG. 3.

The plurality of drivers 300 can have the same structure, and the driver 300 receiving the first and second codes "Pcode<0>" and "Ncode<0>" can have the structure shown in FIG. 6. FIG. 6 is a circuit diagram showing a driver 300 that can be included in the circuit illustrated in FIG. 3. Referring to FIG. 6, the driver 300 can include a first signal transmission unit 310, a first pre-driver 320, a first main driver 330, a first slew rate adjusting unit 340, a second signal transmission unit 350, a second pre-driver 360, a second main driver 370, and a second slew rate adjusting unit 380.

The first signal transmission unit 310 can deliver the first data signal "updo" to the first pre-driver 320 according to the first code "Pcode<0>". The first signal transmission unit 310 can include a NAND gate ND31 and an inverter IV31. The first pre-driver 320 can receive the first data signal "updo" and can generate the first driver driving signal "up". The first pre-driver 320 can include a plurality of transistors M32 and M33 and a resistor RPS2. The first main driver 330 can drive the data input/output pad DQ with the level of the first data signal "updo" according to the first driver driving signal "up". The first slew rate adjusting unit 340 can adjust the slew rate of the first driver driving signal up according to the slew rate control signals "SR_Reg<1:N−1>".

The second signal transmission unit 350 can deliver the second data signal "dndo" to the second pre-driver 360 according to the second code "Ncode<0>". The second signal transmission unit 350 can include a NAND gate ND32 and an inverter IV32. The second pre-driver 360 can receive the second data signal "dndo" and can generate the second driver driving signal "dn". The second pre-driver 360 can include a plurality of transistors M34 and M35 and a resistor RNS2.

The second main driver 370 can drives the data input/output pad DQ with the level of the second data signal "dndo" according to the second driver driving signal "dn". The second slew rate adjusting unit 380 can adjust the slew rate of the second driver driving signal "dn" according to the slew rate control signals "SR_Reg<1:N−1>". Accordingly, the slew rate of data driven by the first and second main drivers 330 and 370 can be determined by the first and second driver driving signals "up" and "dn".

Figure 7:
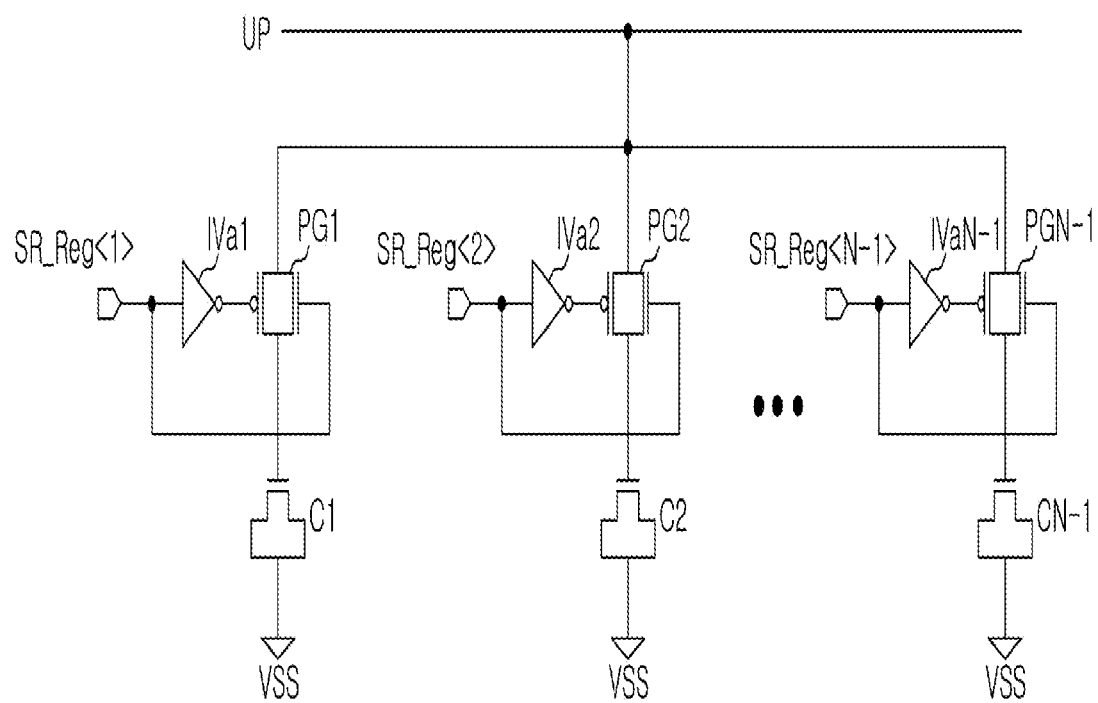
FIG. 7 is a circuit diagram showing a first slew rate adjusting unit that can be included in the circuit illustrated in FIG. 6.

FIG. 7 is a circuit diagram showing a first slew rate adjusting unit 340 that can be included in the circuit illustrated in FIG. 6. It should also be noted that the first and second slew rate adjusting units 340 and 380 can have the same structure; however, only slew rate adjusting unit 340 will be described for simplicity. Referring to FIG. 7, the first slew rate adjusting unit 340 can include a plurality of inverters IVa1 to IVaN−1, a plurality of pass gates PG1 to PGN−1, and a plurality of capacitors C1 to CN−1.

The plurality of inverters IVa1 to IVaN−1 can receive the slew rate control signals "SR_Reg<1:N−1>". The plurality of pass gates PG1 to PGN−1 can have first and second control terminals, which can receive output signals of the inverters IVa1 to IVaN−1 and the slew rate control signals: SR_Reg<1:N−1>", respectively, and first terminals commonly connected to the first driver driving signal "up".

Figure 1:
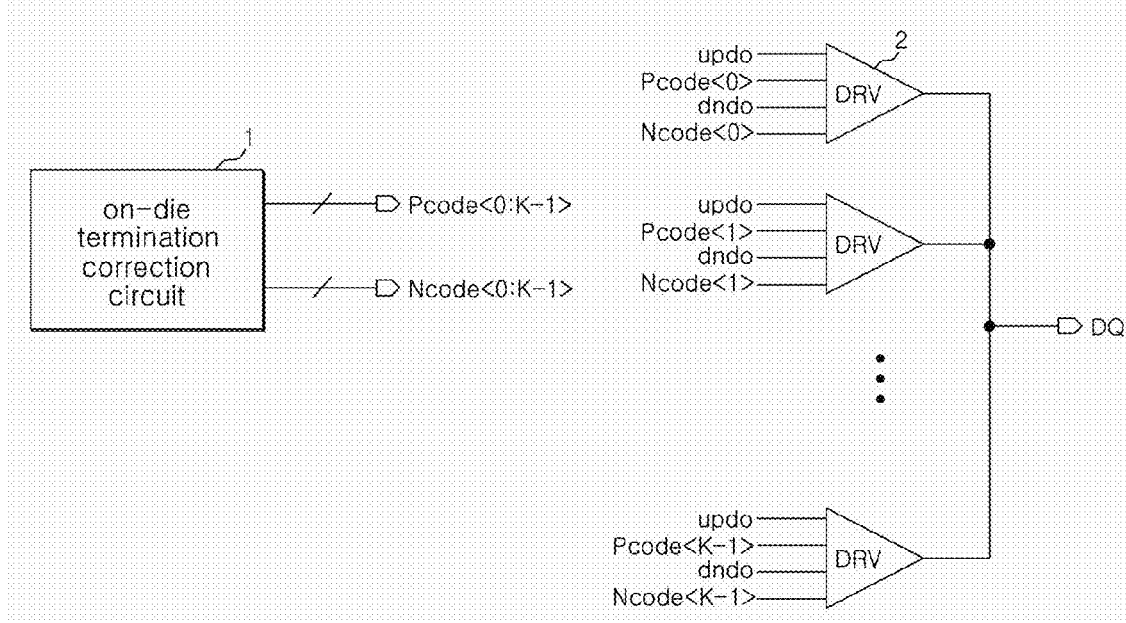
FIG. 1 is a block diagram showing a conventional data output driving circuit.
Figure 2:
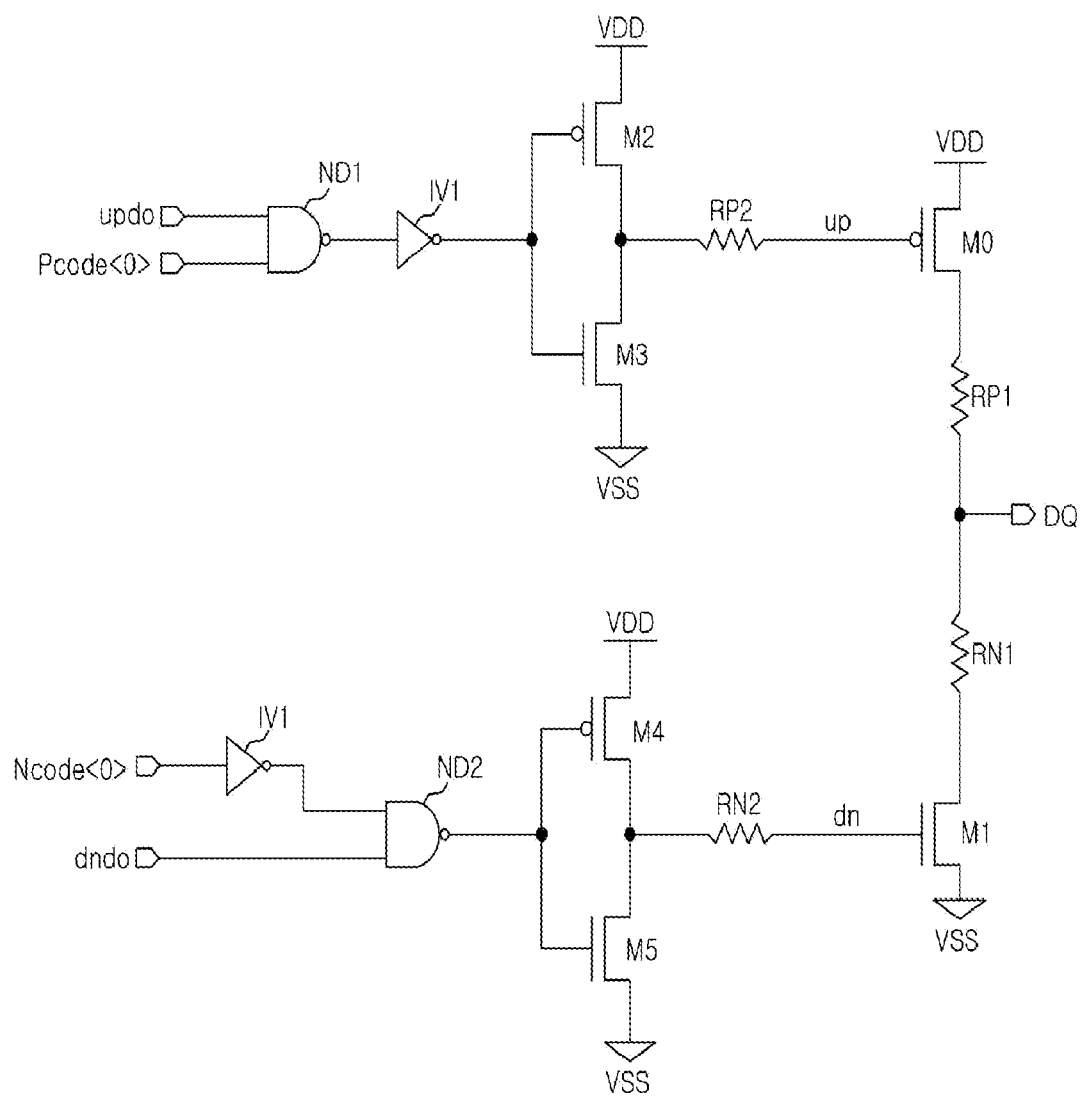
FIG. 2 is a circuit diagram showing a driver that can be included in the circuit illustrated in FIG. 1.

The plurality of capacitors C1 to CN−1 can have first terminals connected to second terminals of the plurality of pass gates PG1 to PGN−1 and second terminals, which can be grounded. The resistors RPS2 and RNS2, connected to output terminals of the first pre-driver 320 and the second pre-driver 360, respectively, can have resistances smaller to those of the conventional resistors RP2 and RN2 shown in FIG. 2. The resistors RPS2 and RNS2 can affect the slew rates of the first and second driver driving signals "up" and "dn" in cooperation with the first and second slew rate adjusting units 340 and 380.

Accordingly, an adjustment range of a slew rate can be increased by adjusting the slew rate by using the first and second slew rate adjusting units 340 and 380 in a state in which the resistors RPS2 and RNS2 have resistances smaller than those of the conventional resistors RP2 and RN2.

In one embodiment, a method for controlling the slew rate of the data output driving circuit comprises periodically detecting the variation of the first and second codes "Pcode<0:K−1>" and "Ncode<0:K−1>". The periodic detection can be performed by the slew rate control signal generating unit 200.

Referring to FIG. 4, whenever the mode register set signal "MRS_SET" is activated, the first and second registers 210 and 220 can store the first and second codes "Pcode<0:K−1>" and "Ncode<0:K−1>" and can output the first and second register values "Preg<0:K−1>" and "Nreg<0:K−1>".

The adder 230 can perform an adding operation with respect to the first and second register values "Preg<0:K−1>" and "Nreg<0:K−1>" and can generate the adding "value code<0:K>". The decoder 240 can decode the adding value "code<0:K>" to generate the decoding signals "coded<0>" to "coded<$2^{k+1}$−1>".

The selecting unit 250 can selectively activate and can output the slew rate control signals "SR_Reg<1:N−1>" according to a section of an activated signal from among the decoding signals "coded<0>" to "coded<$2^{k+1}$−1>".

Referring to FIG. 5, if the decoding signal "coded<$2^{k+1}$−1>" is activated, then the section determination "signal A<3>" can be activated, such that any one of the slew rate control signals "SR_Reg<1:N−1>" is not activated. Additionally, if the decoding signal "coded<$2^{k+1}$−5>" is activated, then the section determination signal "A<2>" can be activated such that the slew rate control signal SR_Reg<1> can be activated. Additionally, if the decoding signal "coded<$2^{k+1}$−9>" is activated, then the section determination signal "A<1>" can be activated, so that the slew rate control signals "SR_Reg<1:2>" can be activated. Additionally, if the decoding signal "coded<$2^{k+1}$−13>" is activated, then the section determination signal "A<0>" can be activated, so that all bits of the slew rate control signals "SR_Reg<1:3>" can be activated.

The decoder 240 and the selecting unit 250 can be designed to have desired output by performing the slew rate measurement simulation according to the variation of the first and second codes "Pcode<0:K−1>" and "Ncode<0:K−1>". After the variation of the first and second codes "Pcode<0:K−1>" and "Ncode<0:K−1>" is detected, the slew rate can be adjusted according to the detected variation of the first and second codes "Pcode<0:K−1>" and "Ncode<0:K−1>". The adjustment operation of the slew rate can be performed in the driver 300 by using the slew rate control signal "SR_Reg<1:N−1>". Thus, the N of the slew rate control signal "SR_Reg<1:N−1>" can be 4.

For example, if the adding value "code<0:K>" of FIG. 4 has the maximum value according to the slow condition, so that the most significant bit of the decoding signals "coded<0>" to "coded<$2^{k+1}$−1>" is activated, then any one of the slew rate control signals "SR_Reg<1:4>" is not activated.

Accordingly, since any one of the slew rate control signals "SR_Reg<1:4>" is not activated, any one of the plurality of capacitors C1 to CN−1 of the first slew rate adjusting unit 340 of FIG. 7 is not connected to a transmission line of the first driver driving signal "up". In addition, since the second slew rate adjusting unit 380 can have the same structure as that of the first slew rate adjusting unit 340, the second slew rate adjusting unit 380 can have the same operation as that of the first slew rate adjusting unit 340.

The slew rates of the first and second driver driving signals "up" and "dn" can be determined by the resistors RPS2 and RNS2 (see FIG. 6) and can have resistances smaller than those of resistors in a conventional data output driving circuit.

Accordingly, a slew rate slower than the target slew rate can be compensated to be faster by the resistors RPS2 and RNS2, which can have resistances smaller than those of resistors in a conventional data output driving circuit. As a result, output data of the first and second main drivers 330 and 370 can output at the target slew rate.

For example, if the adding value "code<0:K>", e.g. of FIG. 4, has the minimum value according to the fast condition, such that the least significant bit of the decoding signals "coded<0>" to "coded<$2^{k+1}$−1>" is activated, then all bits of the slew rate control signals "SR_Reg<1:4>" can be activated. Accordingly, since all bits of the slew rate control signals "SR_Reg<1:4>" can be activated, all capacitors C1 to CN−1 of the first slew rate adjusting unit 340 (see FIG. 7) and the second slew rate adjusting unit 380 can be connected to transmission lines of the first and second driver driving signals "up" and "dn". Furthermore, the slew rates of the first and second driver driving signals "up" and "dn" can be determined by the plurality of capacitors C1 to CN−1 and the resistors RPS2 and RNS2 (see FIG. 6). Accordingly, a slew rate faster than the target slew rate can be compensated to be slower by the plurality of capacitors C1 to CN−1 and the resistors RPS2 and RNS2. As a result, output data of the first and second main drivers 330 and 370 can be output at the target slew rate.

Therefore, as the slew rate of data is faster or slower than the target slew rate, the capacitance of the transmission lines of the first and second driver driving signals "up" and "dn" can be decreased or increased, thereby adjusting the slew rate of the first and second driver driving signals "up" and "dn". Accordingly, the slew rate of data can be maintained at a level of the target slew rate in correspondence with the variation of the PVT. While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A data output driving circuit comprising:
   a slew rate control signal generating unit configured to generate slew rate control signals by using a code signal; and
   a plurality of drivers configured to output data by driving the data at a slew rate set according to the slew rate control signals,
   wherein the plurality of drivers are configured to input the data according to the code signal, and
   wherein the code signal includes first and second codes and wherein the slew rate control signal generating unit generates the slew rate control signals by combining the first and second codes.

2. The data output driving circuit of claim 1, wherein the slew rate control signal generating unit generates the slew rate control signals by decoding an adding result of the first and second codes.

3. The data output driving circuit of claim 2, wherein the slew rate control signal generating unit includes:
   an adder configured to add the first code to the second code;
   a decoder configured to output decoding signals by decoding an output of the adder; and
   a selecting unit configured to selectively activate the slew rate control signals through selective combination of the decoding signals.

4. The data output driving circuit of claim 3, wherein the slew rate control signal generating unit further includes registers configured to store the first code and the second code according to a control signal and to output the first code and the second code to the adder.

5. The data output driving circuit of claim 4, wherein each of the registers is configured to use a mode register set signal as the control signal.

6. The data output driving circuit of claim 1, wherein the drivers include:
   a pre-driver configured to generate a driver driving signal by receiving data according to the code signal;
   a main driver configured to drive an output terminal with a data level according to the driver driving signal; and
   a slew rate adjusting unit configured to adjust a slew rate of the driver driving signal according to the slew rate control signal.

7. The data output driving circuit of claim 6, wherein the slew rate adjusting unit includes:
   a plurality of switching elements that have control terminals configured to receive the slew rate control signal, first terminals commonly connected to a signal line of the driver driving signal, and second terminals; and
   a plurality of capacitors connected between the second terminals of the switching elements and a ground terminal.

8. The data output driving circuit of claim 6, wherein the drivers further include a signal transmission unit configured to transmit the data to the pre-driver according to the code signal.

9. The data output driving circuit of claim 1, wherein the drivers include:
   a first pre-driver configured to generate a first driver driving signal by receiving first data according to the first code;
   a first main driver configured to drive an output terminal with a level of the first data according to the first driver driving signal;
   a first slew rate adjusting unit configured to adjust a slew rate of the first driver driving signal according to the slew rate control signal;
   a second pre-driver configured to generate a second driver driving signal by receiving second data according to the second code;
   a second main driver configured to drive the output terminal with a level of the second data according to the second driver driving signal; and
   a second slew rate adjusting unit configured to adjust a slew rate of the second driver driving signal according to the slew rate control signal.

10. The data output driving circuit of claim 9, wherein the first slew rate adjusting unit includes:
    a plurality of switching elements that have control terminals configured to receive the slew rate control signal, first terminals commonly connected to a signal line of the first driver driving signal, and second terminals; and
    a plurality of capacitors connected between the second terminals of the switching elements and a ground terminal.

11. The data output driving circuit of claim 9, wherein the drivers further include:
    a first signal transmission unit configured to transmit the first data to the first pre-driver according to the first code; and
    a second signal transmission unit configured to transmit the second data to the second pre-driver according to the second code.

* * * * *